US012731960B2

(12) United States Patent
Jagannathan

(10) Patent No.: US 12,731,960 B2
(45) Date of Patent: Sep. 8, 2026

(54) TEMPERATURE-BASED DYNAMIC LASER TUNING TO PROMOTE DISPLAY UNIFORMITY

(71) Applicant: Microsoft Technology Licensing, LLC, Redmond, WA (US)

(72) Inventor: Arunkumar Jagannathan, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 214 days.

(21) Appl. No.: 18/653,870

(22) Filed: May 2, 2024

(65) Prior Publication Data

US 2025/0253617 A1 Aug. 7, 2025

Related U.S. Application Data

(60) Provisional application No. 63/549,338, filed on Feb. 2, 2024.

(51) Int. Cl.
*H01S 5/068* (2006.01)
*G02B 27/01* (2006.01)
(Continued)

(52) U.S. Cl.
CPC ...... *H01S 5/06821* (2013.01); *G02B 27/0172* (2013.01); *G09G 3/3413* (2013.01); (Continued)

(58) Field of Classification Search
CPC .. H01S 5/06821; H01S 5/0617; H01S 5/4093; G02B 27/0172; G02B 2027/0118; G02B 2027/0178; G09G 3/3413
See application file for complete search history.

(56) References Cited

U.S. PATENT DOCUMENTS

2020/0348750 A1 11/2020 Selan
2021/0375179 A1* 12/2021 Sarkar ................ G02B 27/0172

FOREIGN PATENT DOCUMENTS

WO 2021221816 A1 11/2021

OTHER PUBLICATIONS

Extended European search report received in European Application No. 25154118.1, mailed on Mar. 31, 2025, 10 pages.

(Continued)

*Primary Examiner* — Afroza Chowdhury
(74) *Attorney, Agent, or Firm* — Alleman Hall LLP

(57) ABSTRACT

Examples are disclosed that relate to an augmented-reality device including a near-eye display that is configured to provide display uniformity at varying operating temperatures. The near-eye display includes a laser light source that is configured to perform a display scan operation including, for each pixel of a plurality of pixels that collectively form a field of view of the near-eye display, generating a pre-color pulse and subsequently generating a primary color pulse. The augmented-reality device is configured to receive an operating temperature measurement of the laser light source from a temperature sensor. The augmented-reality device is further configured to, for each pixel of the plurality of pixels, dynamically tune an amplitude of the pre-color pulse based at least on the operating temperature measurement of the laser light source, and generate, via the laser light source, the pre-color pulse with the dynamically tuned amplitude, and subsequently generate the primary color pulse.

20 Claims, 9 Drawing Sheets

(51) Int. Cl.
*G09G 3/34* (2006.01)
*H01S 5/06* (2006.01)
*H01S 5/40* (2006.01)

(52) U.S. Cl.
CPC .......... *H01S 5/0617* (2013.01); *H01S 5/4093* (2013.01); *G02B 2027/0118* (2013.01); *G02B 2027/0178* (2013.01)

(56) References Cited

OTHER PUBLICATIONS

Communication under Rule 94(3) Received for European Application No. 25154118.1, mailed on Apr. 7, 2026, 11 pages.

* cited by examiner

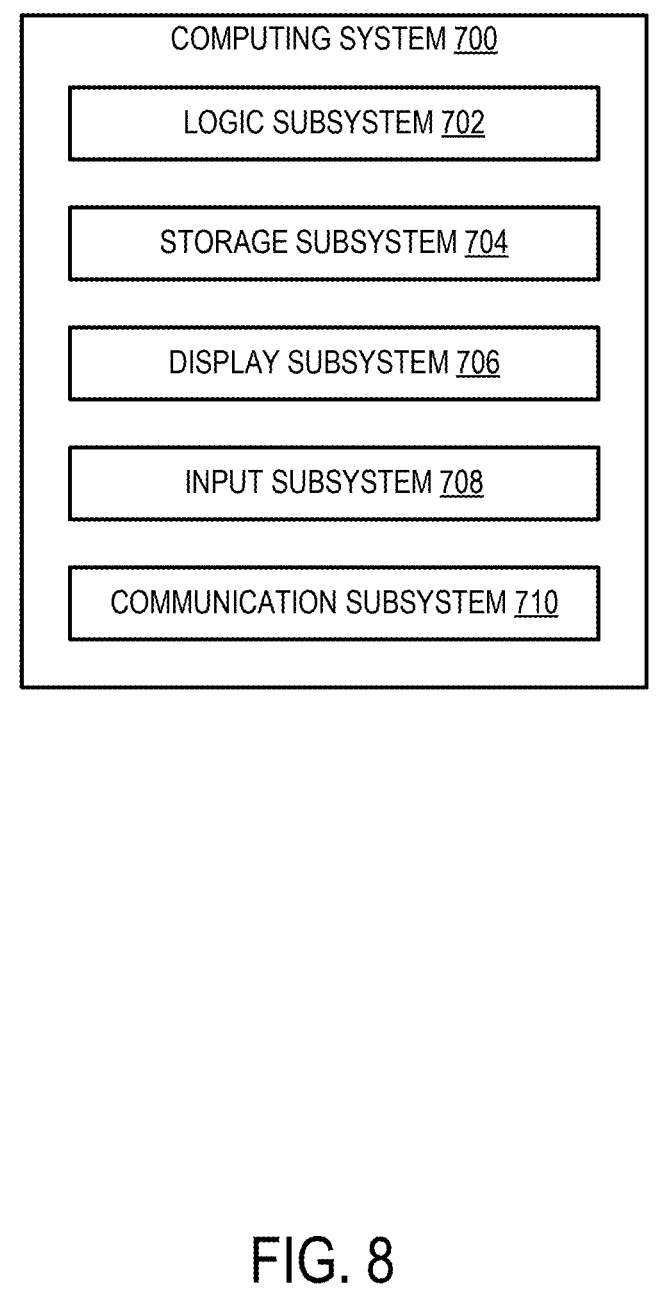

COMPUTING SYSTEM 700

LOGIC SUBSYSTEM 702

STORAGE SUBSYSTEM 704

DISPLAY SUBSYSTEM 706

INPUT SUBSYSTEM 708

COMMUNICATION SUBSYSTEM 710

FIG. 8

TEMPERATURE-BASED DYNAMIC LASER TUNING TO PROMOTE DISPLAY UNIFORMITY

CROSS REFERENCE TO RELATED APPLICATIONS

This application claims priority to U.S. Provisional Patent Application Ser. No. 63/549,338, filed Feb. 2, 2024, the entirety of which is hereby incorporated herein by reference for all purposes.

BACKGROUND

There is a growing demand for more compact, light-weight, and immersive display solutions, especially in the realm of wearable devices. Laser scanning near-eye displays have emerged as a promising innovation to address these needs. Unlike conventional displays, laser scanning near-eye displays employ laser light sources to project images onto the user's retina, creating a virtual display that appears in close proximity to the eye. This technology offers the potential for enhanced portability, reduced form factors, and improved visual experiences, making it a viable visual display technology for applications ranging from augmented-reality (AR) glasses to head-up displays (HUDs) in automotive contexts.

SUMMARY

Examples are disclosed that relate to an augmented-reality device including a near-eye display that is configured to provide display uniformity at varying operating temperatures. The near-eye display includes a laser light source that is configured to perform a display scan operation including, for each pixel of a plurality of pixels that collectively form a field of view of the near-eye display, generating a pre-color pulse and subsequently generating a primary color pulse. The augmented-reality device is configured to receive an operating temperature measurement of the laser light source from a temperature sensor. The augmented-reality device is further configured to, for each pixel of the plurality of pixels, dynamically tune an amplitude of the pre-color pulse based at least on the operating temperature measurement of the laser light source, and generate, via the laser light source, the pre-color pulse with the dynamically tuned amplitude, and subsequently generate the primary color pulse.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 8 shows an example computing system.

DETAILED DESCRIPTION

Figure 1:
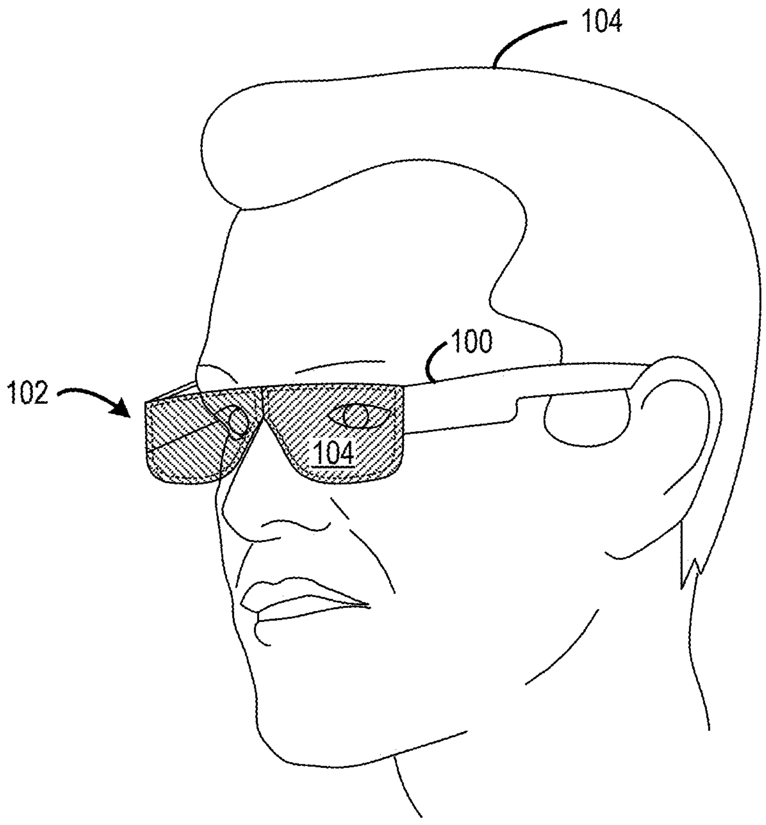
FIG. 1 shows an example augmented-reality (AR) device.

Augmented-reality (AR) devices are used in a broad range of applications ranging from simple consumer applications such as virtual monitors to more complex military applications, such as heads-up displays (HUDs). AR devices include displays that are illuminated using lasers and scanning micromirrors. More particularly, three different wavelengths of laser are used to display content in three colors, namely, red (R), green (G), and blue (B)—these lasers are collectively referred to as RGB lasers. During the display of video content via a near-eye display, the RGB lasers are operated in a pulsed-mode condition, where the lasers are modulated to generate a color pulse and each color pulse for the respective color is combined to fill the net content for a single pixel. As the laser pulses interface with the scanning mirrors, the mirrors are scanned, both vertically and horizontally, to fill the display with content across the field of view (FOV).

Display uniformity refers to the consistency of visual characteristics across the entire FOV of the display. Display uniformity across a FOV of a display is desirable because it ensures that the colors, brightness, and other visual elements appear consistent across the entire FOV while avoiding variations or imperfections that may distract or affect the overall viewing experience. In a laser-based near-eye display of an AR device, display uniformity is affected by the turn-on delay time of the lasers. To address this issue, the lasers of the laser-based near-eye display can be configured to generate a pre-color pulse prior to generating a primary color pulse for a pixel as part of a display scan operation. In particular, the pre-color pulse is a brief, low-energy pulse that is used to prepare the gain medium of the laser to achieve a high-output laser emission faster than would be possible without employing the pre-color pulse. Pre-color pulses can be different amplitudes for different colors of lasers and can vary on an individual basis from one laser to another for the same color.

Typically, display uniformity across a FOV of a near-eye display of an AR device is calibrated at the time of manufacture for operation at a default temperature range (e.g., room temperature (10-25° C.)), which is the temperature range at which the AR device is most commonly operated. More particularly, the lasers of the near-eye display are calibrated to generate pre-color pulses having amplitudes that are optimized for the default temperature range. Such calibration ensures that the near-eye display provides display uniformity across the FOV when the AR device is operated within the default temperate range. However, there are other instances where the AR device can be used in higher temperature operating conditions, such as during first-responder operations and in extreme weather conditions, among other examples. When AR devices with laser-based displays are operated at high operating temperatures (e.g., >40° C.), display uniformity across the FOV degrades. In some examples, the amplitudes of the pre-color pulses generated by the lasers of the near-eye display may not be high enough to properly prepare the laser to generate the primary color pulses fast enough to maintain display uniformity.

Accordingly, examples are disclosed herein relating to optimizing a laser-based display of an AR device at run-time to provide display uniformity at varying operating temperatures. More particularly, the pre-color pulses generated by a laser light source of the laser-based display can be dynamically adjusted at run-time based at least on an operating temperature of the laser light source. By dynamically adjusting the pre-color pulses at run-time based at least on the operating temperature of the laser light source, the pre-color pulses can be suitably adjusted to appropriately prepare the laser light source to generate the primary color pulse fast enough (i.e., on time) in order to provide display uniformity across the FOV of the near-eye display.

FIG. 1 illustrates an example AR device 100 that employs a laser-based near-eye display 102 that is configured to perform run-time optimization based at least on laser operating temperature. As illustrated herein, the AR device 100 is worn and operated by a user 104. The AR device 100 is configured to present virtual imagery, via the laser-based near-eye display 102 in the user's FOV 104. In some implementations, user-input componentry of the AR device 100 may enable the user to interact with the virtual imagery. The AR device 100 takes the form of eyeglasses in the example of FIG. 1. In other examples, the AR device 100 may take the form of goggles, a helmet, or a visor. In still other examples, the AR device 100 may be a component of a non-wearable electronic device, such as a heads-up display. Indeed, the present discussion is applicable to any laser-based display where imprecise display control due to variations in operating temperature is potentially an issue.

The AR device 100 may be configured to cover one or both eyes of the user 104 and may be adapted for monocular or binocular image display. In examples in which the AR device 100 covers only one eye, but binocular image display is desired, a complementary near-eye display device may be arranged over the other eye. In examples in which the AR device 100 covers both eyes and binocular image display is desired, the virtual imagery presented by the AR device 100 may be divided into right and left portions directed to the right and left eyes, respectively. In scenarios in which stereoscopic image display is desired, the virtual imagery from the right and left portions, or complementary laser-based near-eye displays, may be configured with appropriate stereo disparity to present a three-dimensional subject or scene.

Figure 2:
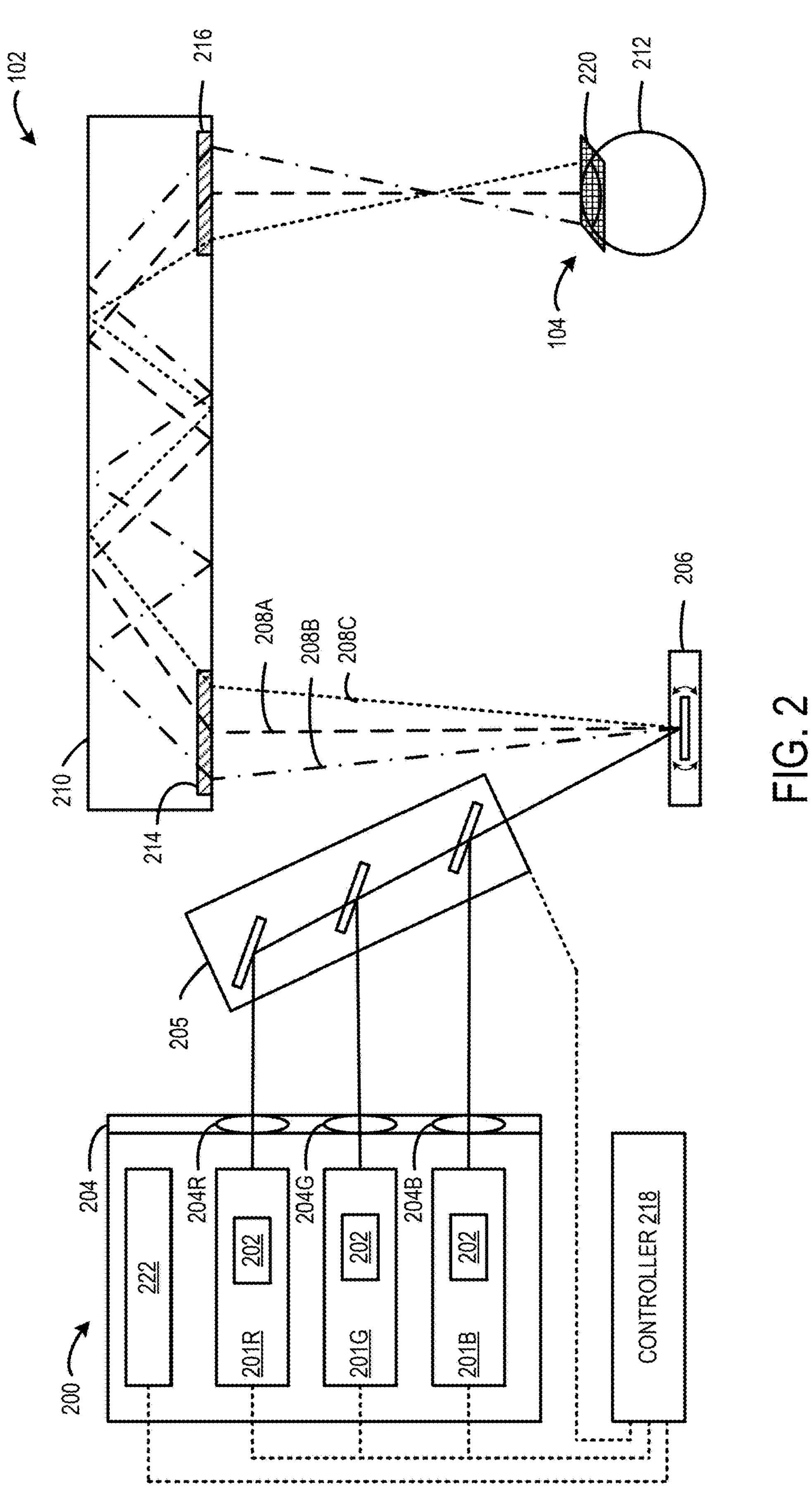
FIG. 2 shows aspects of an example laser-based near-eye display of the AR device of FIG. 1.

FIG. 2 shows aspects of the laser-based near-eye display 102 of FIG. 1 in more detail. Note that FIG. 2 shows a configuration for a left eye of the user 104 and the laser-based near-eye display 102 may include a corresponding configuration for a right eye of the user 104 that is configured in a similar manner (and not shown in FIG. 2). The laser-based near-eye display 102 comprises a laser assembly 200. The laser assembly 200 comprises a plurality of laser light sources 201 which may each emit an associated color of light. For example, red laser light source 201R emits red light, green laser light source 201G emits green light, and blue laser light source 201B emits blue light. Although only three laser light sources 201 are shown, it will be appreciated that the laser assembly 200 may include any suitable number of laser light sources 201. For example, the laser assembly 200 may include 0, 1, 2, 3, or more than 3 red laser light sources; 0, 1, 2, 3, or more than 3 green laser lights sources; and 0, 1, 2, 3, or more than 3 blue laser light sources. In some implementations, the laser assembly 200 may include other laser light sources that emit laser light in other wavelengths (e.g., near-IR, IR).

Each of the laser light sources 201 may be comprised of one or more laser diode emitters 202. For example, each laser light source 201 may include 1, 2, 3, or more than 3 laser diode emitters of a suitable color. Any combination or modification in the number of laser diode emitters may also be available (e.g., 2 red, 2 green, 2 blue, or 1 red, 1 green, 2 blue, etc.). Accordingly, any suitable number of laser light sources may be used to irradiate/illuminate pixels for generating image content. Further, each laser light source may have a suitable number of laser diode emitters 202, which may be singular or arranged in an array for example.

In some, though not all, configurations, the laser assembly 200 also includes a collimating lens assembly 204 (or other diffractive optical element) that is structured to direct light to another location or otherwise operate on the light in some manner. In this example, each of the laser light sources 201R, 201G, and 201B has a corresponding collimating lens 204, individually labeled 204R, 204G, 204B. In some implementations, however, a single collimating lens may be used for more than one laser light source.

The laser-based near-eye display 102 includes combination optics 205 configured to spatially combine the light beams lased from the plurality of laser light sources 201R, 201G, and 201B into a single light beam.

The laser-based near-eye display 102 includes a micro-electro-mechanical systems (MEMS) mirror system 206. The MEMS mirror system 206 is configured to collect laser light from the combination optics 205, which combines light lased from three different sources (i.e., the laser light sources 201R, 201G, and 201B) into a single light beam, in this example. Additionally, the MEMS mirror system 206 is configured to direct laser light 208A (which, in this example includes red laser light, green laser light, and blue laser light) to a waveguide 210. Furthermore, the MEMS mirror system 206 is configured to redirect its mirrors/mirror array so that the laser light 208A is aimed at different locations at the waveguide 210. As shown, laser lights 208B and 208C are aimed at different locations on the waveguide 210. In this manner, the MEMS mirror system 206 is able to route light to different locations by adjusting the aim of its corresponding mirror array. It will be appreciated that the laser lights 208A-C may be modulated to include varying degrees or intensities (or even an absence of any one or more) of red, green, blue, or other color, laser light.

The waveguide 210 is configured to redirect or propagate the laser light 208A-C to a desired location which is viewable by the user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210.

By configuring the entry grating 214 and the exit grating 216 to meet certain design parameters, the MEMS mirror system 206 is able to use waveguide 210 to propagate light towards the user's eye 212.

The laser assembly 200 and the MEMS mirror system 206 are controlled by a controller 218. The controller 218 is configured to control the MEMS mirror system 206, in conjunction with the laser assembly 200 to progressively scan a set of pixels 220 that collectively the FOV 104 of the near-eye display 102 shown in FIG. 1. In particular, the controller 218 is configured to adjust MEMS mirror system 206 so that the combined RGB laser beam or light is aimed at different locations for a user's eye 212 to view. Individual pixels of the set of pixels 220 may be scanned in such a rapid manner that the entirety of a resulting image appears before the user's eye 212 in the FOV 104 without the user perceiving that the image was progressively scanned pixel by pixel and line by line. In this way, the laser-based near-eye display 102 may project or render image content for a user to view in the FOV 104.

The MEMS mirror system 206 may be able to scan an image (i.e., pixels of that image) at any image resolution or range of image resolutions (e.g., in cases where foveated rendering is used). In one example, the MEMS mirror system 206 is configured to scan RGB light from the laser assembly 200 with a resolution of 2,000 pixels by 1,200 pixels. In other examples, the MEMS mirror system 206 is configured to scan RGB light from the laser assembly 200 with another resolution.

During a display scan operation, the controller 218 is configured to control the laser light sources 201 to generate pre-color pulses in order to enable the laser light sources 201 to generate primary color pulses in a timely manner that facilities display uniformity across the FOV of the laser-based near-eye display 102. However, as discussed above, as the operating temperature of the laser light sources 201 fluctuates (e.g., rises above a threshold temperature), pre-color pulses optimized for a default temperature range can become insufficient to suitably prepare the laser light sources 201 to generate the primary color pulses fast enough to maintain display uniformity.

Figure 3:
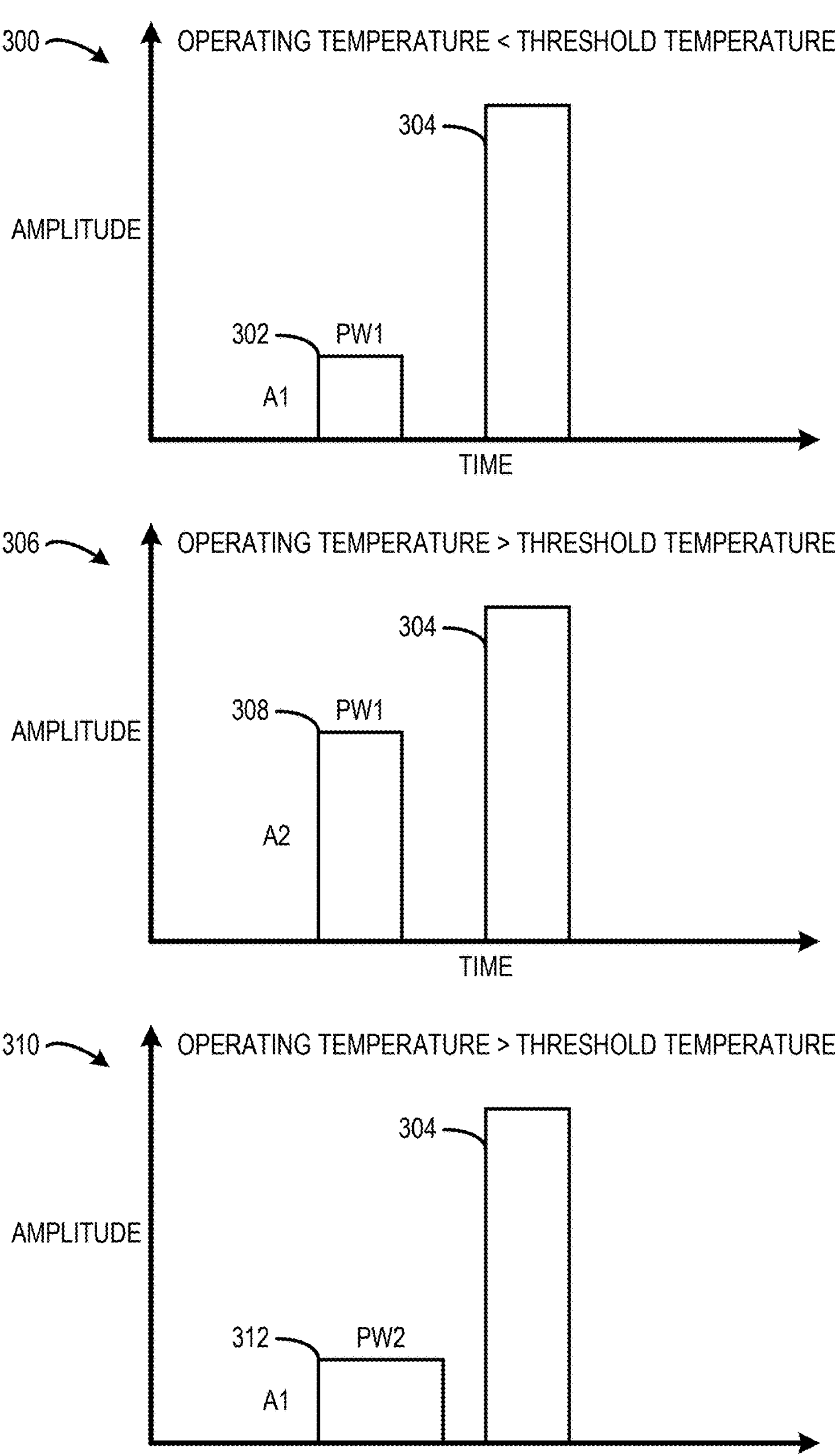
FIG. 3 shows a graph of an example pre-color pulse and an example primary color pulse.

FIG. 3 shows graphs of different example pre-color pulses generated at different operating temperatures of a laser light source of an AR device to maintain display uniformity of a near-eye display of the AR device. A graph 300 shows a first pre-color pulse 302 and a first primary color pulse 304 that are generated for an operating temperature of the laser light source that is less than a threshold temperature. The first pre-color pulse 302 has a first amplitude value (A1) and a first pulse width value (PW1). In some examples, the first amplitude value (A1) also may be referred to as the default amplitude value and the first pulse width value (PW1) may be referred to as the default pulse width value, since these values may be used for operation when the operation temperature is less than the threshold temperature, in this example.

In different examples, characteristics of the pre-color pulse can be adjusted differently to compensate for an operating temperature of the laser light source that is greater than the threshold temperature. In one example, a graph 306 shows a second pre-color pulse 308 and the primary color pulse 304 that are generated for an operating temperature of the laser light source that is greater than the threshold temperature. The second pre-color pulse 308 has a second amplitude value (A2) that is greater than the first amplitude value (A1) of the first pre-color pulse 302. The second pre-color pulse 308 has the first pulse width value (PW1) that is the same as the first pre-color pulse 302. In this example, the amplitude of the second pre-color pulse 308 is increased relative to the first pre-color pulse 302 to account for the increase in operating temperature of the laser light source.

In another example, a graph 310 shows a third pre-color pulse 312 and the primary color pulse 304 that are generated for an operating temperature of the laser light source that is greater than the threshold temperature. The third pre-color pulse 312 has a second pulse width value (PW2) that is greater than the first pulse width value (PW1) of the first pre-color pulse 302. The third pre-color pulse 312 has the first amplitude value (PW1) that is the same as the first pre-color pulse 302. In this example, the pulse width of the third pre-color pulse 312 is increased relative to the first pre-color pulse 302 to account for the increase in operating temperature of the laser light source.

In other examples, both the amplitude and the pulse width of a pre-color pulse may be increased relative to the first pre-color pulse 302 to account for the increase in operating temperature of the laser light source.

Figure 4:
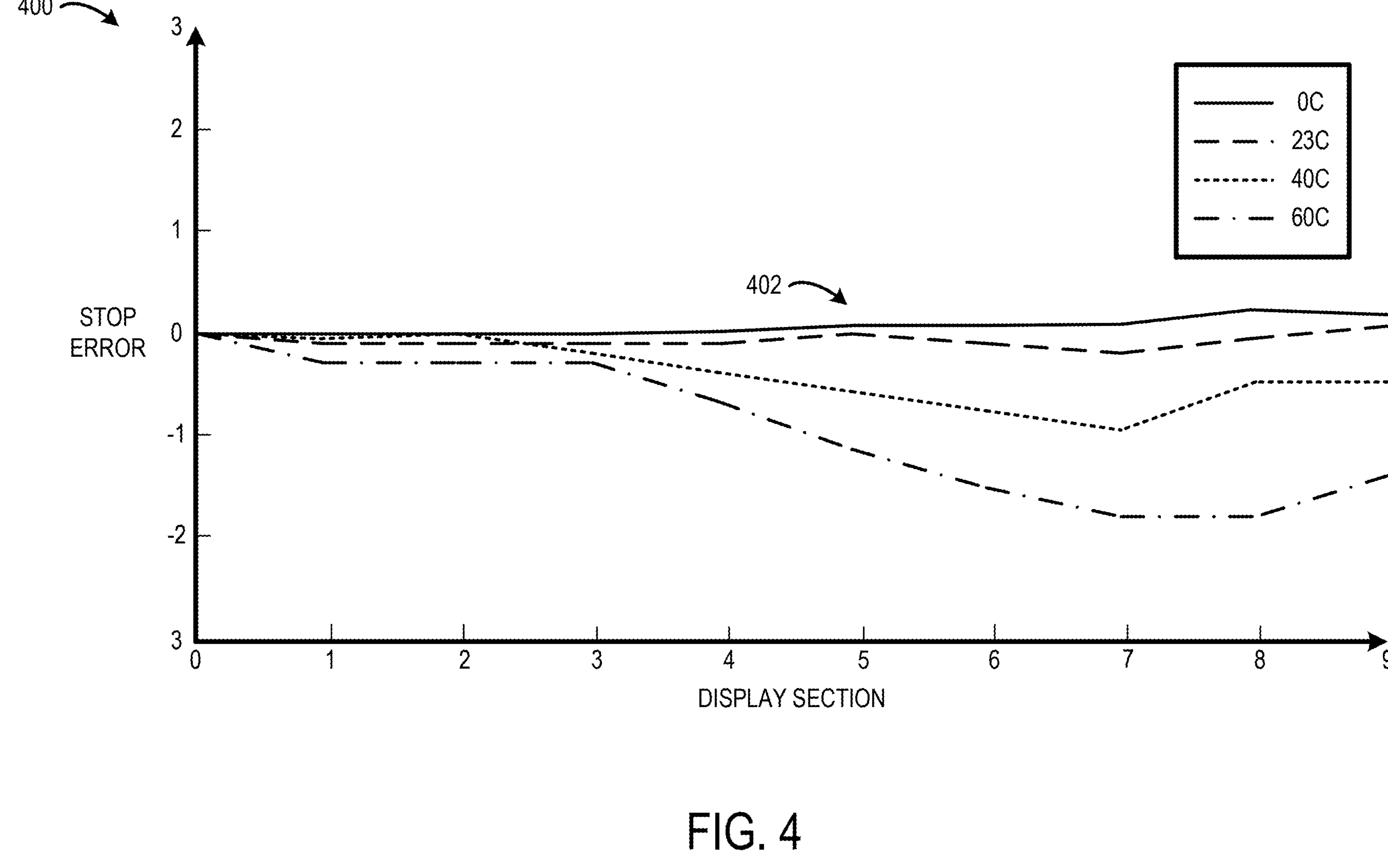
FIG. 4 shows an example graph of stop errors indicating degradation of display uniformity in different sections of a field of view (FOV) of a laser-based near-eye display at different operating temperatures.

FIG. 4 shows an example graph 400 of stop errors indicating degradation of display uniformity in different sections of a FOV of a laser-based near-eye display at different operating temperatures. The display sections along the X-axis of the graph 400 indicate different sections of the FOV of the laser-based near-eye display. In the illustrated example, the laser-based near-eye display is divided into nine sections. Section 0 refers to a center point of the FOV and the sections move radially outward from section 0 to section 9 that corresponds to the periphery of the FOV. The display uniformity is measured by generating a low brightness image and measuring the light levels at stops in different display sections across the FOV. The stop errors along the Y-axis of the graph 400 indicate deviations in intensity of light output by the laser-based near-eye display. A stop error of 0 indicates that the actual intensity of light output by the laser-based near-eye display is as expected. A stop error that is greater than 0 indicates that the actual intensity of light output by the laser-based near-eye display is greater than expected. A stop error that is less than 0 indicates that the actual intensity of light output by the laser-based near-eye display is less than expected. For example, a stop error of −1 corresponds to 50% reduction in intensity of light output by the laser-based near-eye display relative to an intensity of output light.

The graph 400 includes a plurality of plots 402 of stop errors in different sections of the FOV generated at different operating temperatures. At lower operating temperatures (e.g., 0° C.), the laser-based near-eye display operates with minimal stop errors across the sections of the display, which indicates relatively good display uniformity. As the operating temperature increases beyond a threshold temperature (e.g., 20° C.), stop errors increase particularly around the outer sections of the display (e.g., sections 5-9), such that display uniformity degrades. Such degradation in display uniformity is attributed to the default pre-color pulses not being sufficiently powerful enough to properly prepare the laser light sources to generate the primary color pulses in a timely manner when the operating temperature is greater than the threshold temperature.

Returning to FIG. 2, in order to address the issues related to degradation of display uniformity, the laser-based near-eye display 102 is configured to, at run-time, dynamically tune the pre-color pulses as a function of operating temperature in order to achieve good display uniformity. To that end, the laser assembly 200 includes a temperature sensor 222 that is configured to output an operating temperature measurement of the plurality of laser light sources 201. Note that the plurality of laser light sources 201 can be co-located on the same integrated circuit or the same device package in close proximity to one another, such that the plurality of laser light sources 201 have relatively the same operating temperature.

Note that the operating temperature of the plurality of laser light sources 201 is influenced by both the ambient temperature and the operating conditions of the plurality of laser light sources 201. For example, the operating temperature of a laser light source is higher when the laser light source is repeatedly generating high-intensity color pulses (e.g., for a bright image). Further, the operating temperature of a laser light source is lower when the laser light source is repeatedly generating low-intensity color pulses (e.g., for a dim image).

The controller 218 is configured to receive the operating temperature measurement from the temperature sensor 222, and for each laser light source 201 and for each pixel of the plurality of pixels 220, dynamically tune an amplitude of the pre-color pulse based at least on the operating temperature measurement of the laser light sources 201. The controller 218 is further configured to generate, via the laser light sources 201, the pre-color pulses with the dynamically tuned amplitudes, and subsequently generate the primary color pulses to illuminate the corresponding pixel.

Note that the behaviors of the laser light sources 201 vary on an individual basis (e.g., due to manufacturing tolerances, wavelength of light emitted by the different laser light sources, different responses to operating temperature variances). Thus, each of the laser light sources 201 can be dynamically tuned based at least on the operating temperature measurement on an individual basis.

In some implementations, the controller 218 is configured to dynamically tune the amplitude of the pre-color pulse of a laser light source 201, such that when the operating temperature measurement is less than a threshold temperature (e.g., 20° C.), the pre-color pulse is generated with a default amplitude. Further, when the operating temperature measurement is greater than the threshold temperature, the amplitude of the pre-color pulse is increased relative to the default amplitude.

In some implementations, the amplitude of the pre-color pulse of a laser light source 201 is dynamically tuned as a function of the operating temperature measurement.

Figure 5:
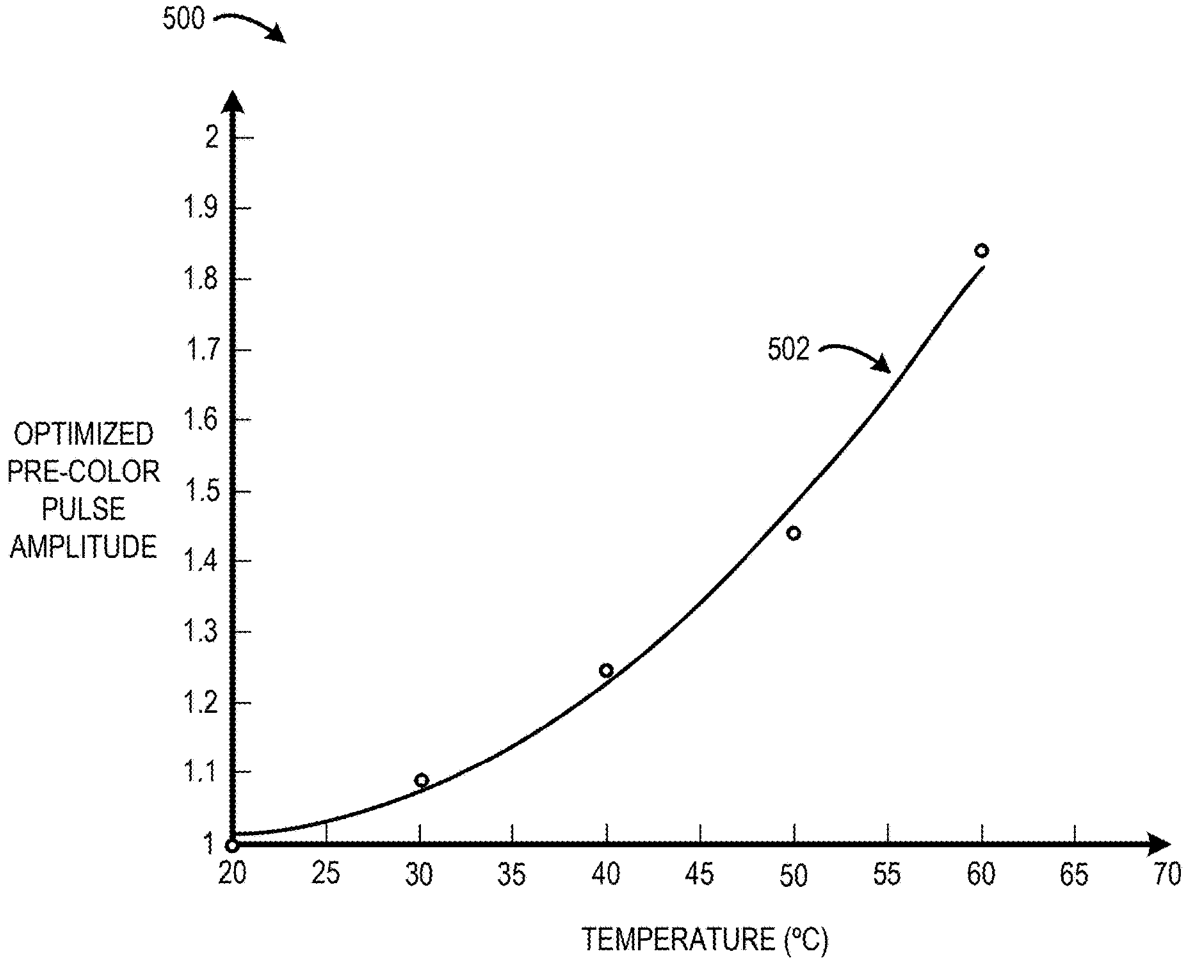
FIG. 5 shows an example graph of measured optimal pre-color pulse amplitude values as a function of measured operating temperatures of laser light sources.

FIG. 5 show an example graph 500 of optimal pre-color pulse amplitude values for different operating temperatures and a corresponding function 502 fit to the optimal pre-color pulse amplitude values. An error bar is calculated by calculating the standard deviation and dividing it by the square root of N, where N is the sample size (e.g., N=4 in the illustrated example). The Y-axis of the graph 500 is normalized to the pre-color pulse amplitude value measured at 20° C. during calibration of the AR device 100. A quadratic polynomial function fits the data with a r-square>0.95. In one example, the temperature-dependent normalized pre-color pulse amplitude value is defined as $P_T(T)$, where:

$$P_T(T) = P_{cal}\left[A_1\left(T^2\right) + B_2(T) + C_2\right],$$

where $A_1$, $B_1$, and $C_1$ are the coefficients of the quadratic polynomial function calculated from the quadratic fit to the data shown in the graph 500 of FIG. 5. The optimal pre-color pulse values in FIG. 5 (dots) are measured systematically at different operating temperatures. For the samples used to demonstrate this method, the measured coefficients are A1=0.0008401, B1=−0.04503, and C1=1.621. Note that the values optimized for the different operating temperatures increase exponentially as the operating temperature increases.

Returning to FIG. 2, in some implementations, during runtime operation of the AR device 100, when the operating temperature of the laser light sources 201 exceeds the threshold temperature, the pre-color pulse amplitude values of the laser light sources 201 are tuned in real-time using the above equation based on the measured operating temperature.

In some implementations, the controller 218 is configured to store a look-up table that maps the operating temperature measurements to amplitude values of the pre-color pulses for each of the plurality of laser light sources 201. The controller 218 is further configured to control the plurality laser light sources 201 to generate the pre-color pulses with the amplitude values output from the look-up table.

In some implementations, the pulse width of the pre-color pulses are fixed. In other implementations, the pulse width of the pre-color pulses may be adjustable. In some such implementations, the controller 218 is configured to dynamically tune the pulse width and the amplitude of the pre-color pulses based at least on the operating temperature measurement of the plurality of laser light sources 201. For example, the pulse width of the pre-color pulses may be increased from a default pulse width as the operating temperature of the plurality of laser light sources 201 increases.

In some implementations, the controller 218 is configured to store a look-up table that maps the operating temperature measurements to pulse width values of the pre-color pulses for each of the plurality of laser light sources 201. The controller 218 is further configured to control the plurality laser light sources 201 to generate the pre-color pulses with the pulse width values output from the look-up table.

The controller 218 may be configured to dynamically tune the amplitude (and/or pulse width) of the pre-color pluses according to any suitable update rate. In some examples, the update rate may correspond to a frame rate of the laser-based near-eye display 102. In other examples, the update rate may be lower than the frame rate in order to balance power consumption from performing additional processing operations. For example, the update rate may correspond to every 10, 20, 50, or more image frames.

In some implementations, the update rate may be dynamically adjusted based at least on various operating conditions of the AR device 100. In one example, the update rate may be dynamically adjusted based at least on the rate of change of the laser operating temperature under maximum display load. For example, from measurements at maximum display load, the maximum rate of change of operating temperature that the red laser source 201R is capable of is approximately 1° C./image frame. Based on this rate of change, a pre-color pulse value update rate for every 20 frames (e.g., 220 milliseconds) would be sufficient to compensate for the degradation of low luminance uniformity. The update rate may be dependent on the operating temperature rate of change capabilities of the individual laser light sources. In another example, the update rate may be dynamically adjusted based at least on the operating temperature being greater than a threshold temperature. In yet another example, the update rate may be dynamically adjusted based at least on varying sensor usage of the AR device 100. In yet another example, the update rate may be dynamically adjusted based at least on switching between different modes of operation of the AR device 100 (e.g., switching between a low-light or night vision mode and a daylight mode, switching between monocular and binocular modes). The update rate may be dynamically adjusted based on any suitable operating conditions.

In some implementations, the operating temperature of the plurality of laser light sources 201 may be inferred based at least on other operating conditions of the AR device 100 in instances where the temperature sensor 222 degrades or is omitted from the laser-based near-eye display 102. Example operating conditions may include inferring temperature based at least on other operating parameters of the laser light sources (e.g., outputting high-brightness content for a designated duration or number of frames), switching between operating modes of the AR device 100, receiving temperature information from a third party, inferring temperature information from other environmental sensor information. The operating temperature of the laser light sources 201 may be inferred from any suitable information derived from operating conditions of the AR device 100.

Dynamic tuning of the pre-color pulse amplitude values may be beneficial in various operation conditions relative to using default amplitude values. In one example, when the AR device 100 is operated at an ambient room temperature (e.g., less than 20° C.), and when the user initially turns on the AR device 100 and displays video content, the operating temperature of the plurality of laser light sources 201 may rapidly increase. By dynamically tuning the pre-color pulse amplitude values, the AR device 100 may have good display uniformity when the AR device 100 first turns on.

In another example, when the AR device 100 is operated at an ambient room temperature and the user switches from a low load video content to a high load video content or vice versa, the operating temperature of the plurality of laser light sources 201 may rapidly change. By dynamically tuning the pre-color pulse amplitude values, the AR device 100 may have consistent display uniformity during transitions between displaying bright content and dim content.

In another example, when the AR device 100 is operated in high ambient temperature conditions, the operating temperature of the plurality of laser light sources 201 is also high. By dynamically tuning the pre-color pulse amplitude values, the AR device 100 may have good display uniformity during operation at high ambient temperatures. In another example, when a plurality of sensors of the AR device 100 are actively used, the operating temperature of the plurality of laser light sources 201 is also high due to heat dissipation from the sensors. By dynamically tuning the pre-color pulse amplitude values, the AR device 100 may have good display uniformity during operation under such conditions.

Note that the principles disclosed herein are applicable to any type of laser-based display unit and not only to architectures with the MEMS mirror system 206.

Figure 6:
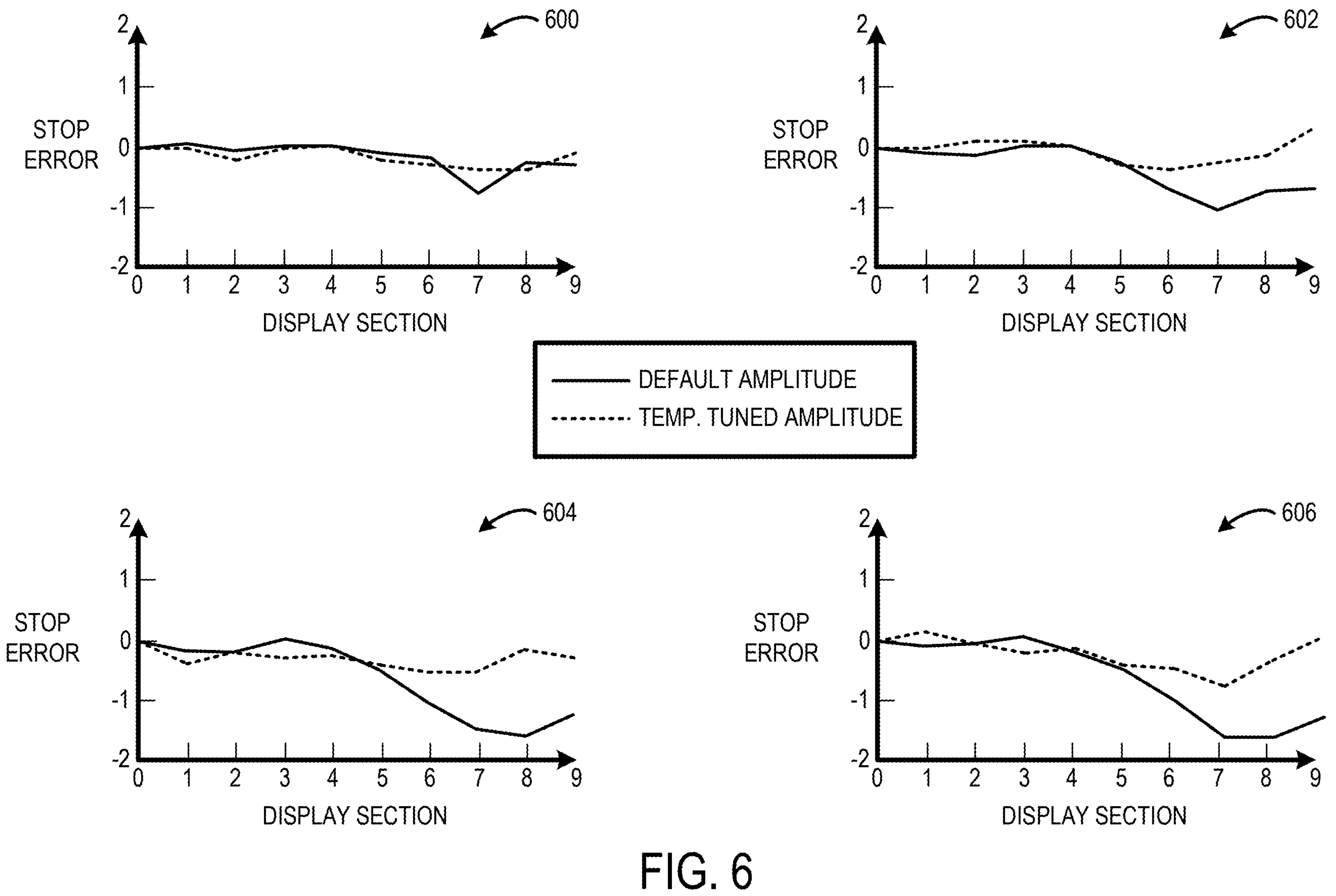
FIG. 6 shows different example graphs comparing display uniformity performance of a laser-based near-eye display using dynamically tuned pre-color pulse amplitude values determined based at least on operating temperature versus using default pre-color pulse amplitude values for different operating temperatures.

FIG. 6 shows different example graphs 600, 602, 604, 606 comparing display uniformity performance of the laser-based near-eye display 102 using dynamically tuned pre-color pulse amplitude values determined based at least on operating temperature versus using default pre-color pulse amplitude values for different operating temperatures. In the graphs 600, 602, 604, 606, the dotted line indicates the display uniformity performance of the laser-based near-eye display 102 using dynamically tuned pre-color pulse amplitude values and the solid line indicates the display uniformity performance of the laser-based near-eye display 102 using default pre-color pulse amplitude values.

The graph 600 shows the performance comparison at an operating temperature of 40° C. In particular, the dynamically tuned pre-color pulse amplitude values provide a display uniformity performance increase at least in section 7 relative to the default pre-color pulse amplitude values.

The graph 602 shows the performance comparison at an operating temperature of 50° C. In particular, the dynamically tuned pre-color pulse amplitude values provide a display uniformity performance increase at least in sections 6-9 relative to the default pre-color pulse amplitude values.

The graph 604 shows the performance comparison at an operating temperature of 60° C. In particular, the dynamically tuned pre-color pulse amplitude values provide a display uniformity performance increase at least in sections 6-9 relative to the default pre-color pulse amplitude values. These performance gains are greater than the performance gains achieved when the operating temperature is 50° C.

The graph 606 shows the performance comparison at an operating temperature of 70° C. In particular, the dynamically tuned pre-color pulse amplitude values provide a display uniformity performance increase at least in sections 6-9 relative to the default pre-color pulse amplitude values. These performance gains are greater than the performance gains achieved when the operating temperature is 0° C.

Figure 7A:
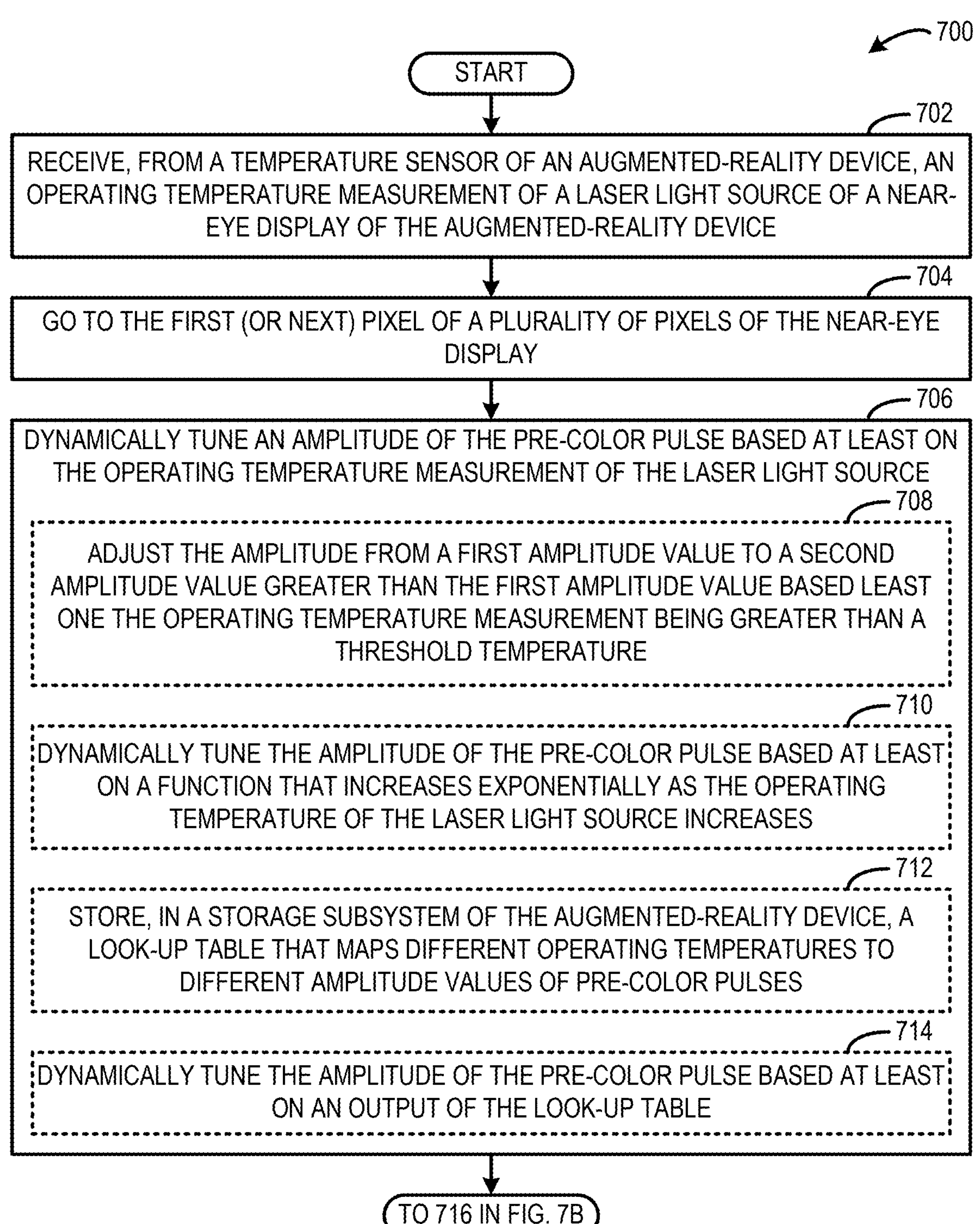
FIGS. 7A-7B show a flowchart of an example method for controlling an augmented-reality device including a near-eye display to provide display uniformity at varying operating temperatures.
Figure 7B:
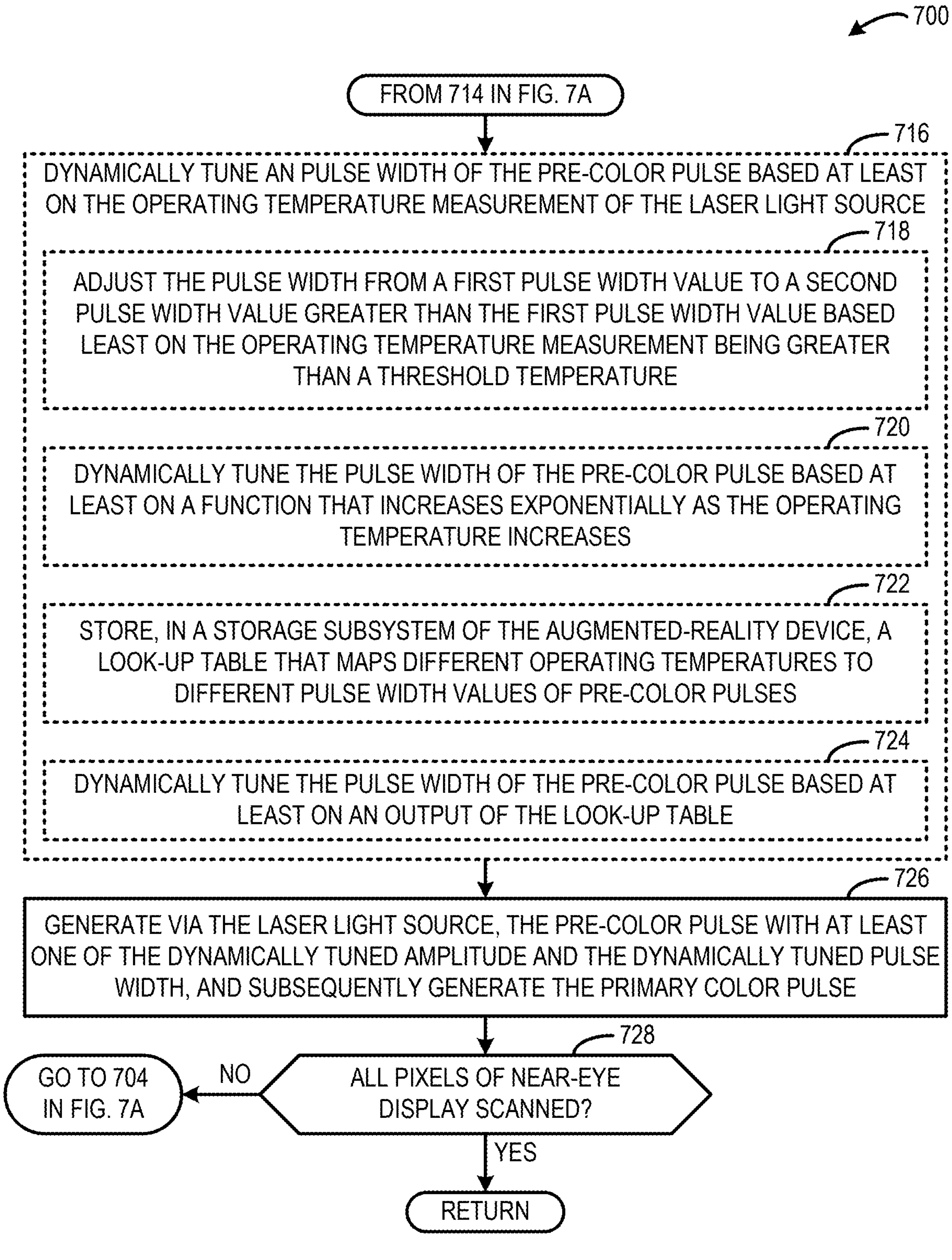

FIGS. 7A-7B show an example method 700 for controlling an augmented-reality device including a near-eye display to provide display uniformity at varying operating temperatures. For example, the method may be performed by the augmented-reality device 100 shown in FIG. 1. Note that method steps displayed in dashed boxes are optional in some implementations.

In FIG. 7A, at 702, the method 700 includes receiving, from a temperature sensor of an AR device, an operating temperature measurement of a laser light source of a near-eye display of the AR device.

The near-eye display is configured to perform a display scan operation to display an image frame. The display scan operation includes scanning each pixel of a plurality of pixels that collectively form a field of view of the near-eye display. At 704, the method 700 includes going to a first (or next) pixel of the plurality of pixels of the near-eye display to illuminate the pixel for the display scan operation.

At 706, the method 700 includes dynamically tuning an amplitude of a pre-color pulse based at least on the operating temperature measurement of the laser light source.

In some implementations, at 708, the method 700 may include adjusting the amplitude from a first amplitude (referred to as the default amplitude in some examples) to a second amplitude that is greater than the first amplitude based at least on the operating temperature measurement being greater than a threshold temperature. In one example, the threshold temperature is set at 20° C. In other examples, the threshold temperature may be set to a different temperature.

In some implementations, at 710, the method 700 may include dynamically tuning the amplitude of the pre-color pulse based at least on a function that increases exponentially as the operating temperature of the lase light source increases.

In some implementations, at 712, the method 700 may include storing, in a storage subsystem of the AR device, a look-up table that maps different operating temperatures to different amplitude values of pre-color pulses. At 714, the method 700 may include dynamically tuning the amplitude of the pre-color pulse based at least on an output of the look-up table.

In FIG. 7B, in some implementations, at 716, the method 700 may include dynamically tuning a pulse width of the pre-color pulse based at least on the operating temperature measurement of the laser light source. In some implementations, at 718, the method 700 may include adjusting the pulse width from a first pulse width (referred to as the default pulse width in some examples) to a second pulse width that is greater than the first pulse width based at least on the operating temperature measurement being greater than a threshold temperature. In one example, the threshold temperature is set at 20° C. In other examples, the threshold temperature may be set to a different temperature. In some implementations, at 720, the method 700 may include dynamically tuning the pulse width of the pre-color pulse based at least on a function that increases exponentially as the operating temperature of the laser light source increases. In some implementations, at 722, the method 700 may include storing, in a storage subsystem of the AR device, a look-up table that maps different operating temperatures to different pulse width values of pre-color pulses. At 724, the method 700 may include dynamically tuning the pulse width of the pre-color pulse based at least on an output of the look-up table.

At 726, the method 700 includes generating, via the laser light source, the pre-color pulse with at least one of the dynamically tuned amplitude and the dynamically tuned pulse width, and subsequently generating the primary color pulse. In some implementations, the amplitude of the pre-color pulse may be dynamically tuned, and the pulse width may be fixed. In other implementations, the amplitude and the pulse width of the pre-color pulse may be dynamically tuned. In still other implementations, the pulse width of the pre-color pulse may be dynamically tuned, and the amplitude may be fixed.

At 728, the method 700 includes determining if each pixel of the near-eye display has been scanned for the display scan operation to collectively display an image frame. If each pixel of the near-eye display has been scanned, then the display scan operation to display an image frame is complete and the method 700 returns to other operations. Otherwise, if other pixels of the near-eye display still need to be scanned, then the method 700 moves to 704 in FIG. 7A and the display scan operation continues until each pixel of the near-eye display has been scanned.

The method 700 may be performed to control an AR device to provide display uniformity at varying operating temperatures. By dynamically adjusting the pre-color pulses at run-time based at least on the operating temperature of the laser light source, the pre-color pulses can be suitably adjusted to appropriately prepare the laser light source to generate the primary color pulse fast enough (i.e., on time) in order to provide display uniformity across the FOV of the near-eye display.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

FIG. 8 schematically shows a simplified representation of a computing system 800 configured to provide any to all of the compute functionality described herein. For example, the computing system 800 may correspond to the augmented-reality computing device 100 shown in FIG. 1 and the laser-based near-eye display 102 including the controller 218 shown in FIG. 2. Computing system 800 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 800 includes a logic subsystem 802 and a storage subsystem 804. Computing system 800 may optionally include a display subsystem 806, input subsystem 808, communication subsystem 810, and/or other subsystems not shown in FIG. 8.

Logic subsystem 802 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem may optionally be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 804 includes one or more physical devices configured to temporarily and/or permanently hold computer information such as data and instructions executable by the logic subsystem. When the storage subsystem includes two or more devices, the devices may be collocated and/or remotely located. Storage subsystem 804 may include volatile, nonvolatile, dynamic, static, read/write, read-only, random-access, sequential-access, location-addressable, file-addressable, and/or content-addressable devices. Storage subsystem 804 may include removable and/or built-in devices. When the logic subsystem executes instructions, the state of storage subsystem 804 may be transformed—e.g., to hold different data.

Aspects of logic subsystem 802 and storage subsystem 804 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

The term "module" may be used to describe an aspect of computing system 800 implemented to perform a particular function. In some cases, a module may be instantiated via logic machine 802 executing instructions held by storage subsystem 804. It will be understood that different modules may be instantiated from the same application, service, code block, object, library, routine, API, function, etc. Likewise, the same module may be instantiated by different applications, services, code blocks, objects, routines, APIs, functions, etc. The term "module" may encompass individual or groups of executable files, data files, libraries, drivers, scripts, database records, etc.

When included, display subsystem 806 may be used to present a visual representation of data held by storage subsystem 804. This visual representation may take the form of a graphical user interface (GUI). Display subsystem 806 may include one or more display devices utilizing virtually any type of technology. In some implementations, display subsystem may include one or more virtual-, augmented-, or mixed reality displays.

When included, input subsystem 808 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 810 may be configured to communicatively couple computing system 800 with one or more other computing devices. Communication subsystem 810 may include wired and/or wireless communication devices compatible with one or more different communication protocols. The communication subsystem may be configured for communication via personal-, local- and/or wide-area networks.

In an example, an augmented-reality device comprises a near-eye display including a laser light source configured to perform a display scan operation, wherein the display scan operation includes, for each pixel of a plurality of pixels that collectively form a field of view of the near-eye display, generating a pre-color pulse and subsequently generating a primary color pulse, a temperature sensor configured to output an operating temperature measurement of the laser light source, a logic subsystem, and a storage subsystem holding instructions executable by the logic subsystem to receive the operating temperature measurement from the temperature sensor; and for each pixel of the plurality of pixels of the near-eye display, dynamically tune an amplitude of the pre-color pulse based at least on the operating temperature measurement of the laser light source; and generate, via the laser light source, the pre-color pulse with the dynamically tuned amplitude, and subsequently generate the primary color pulse. In this example and/or other examples, dynamically tuning the amplitude of the pre-color pulse may include setting the amplitude to a first amplitude value based at least on the operating temperature being less than a threshold temperature and setting the amplitude to a second amplitude value greater than the first amplitude value based least one the operating temperature being greater than the threshold temperature. In this example and/or other examples, the amplitude of the pre-color pulse may be dynamically tuned based at least on a function that increases exponentially as the operating temperature increases. In this example and/or other examples, the storage subsystem may hold instructions executable by the logic subsystem to store, in the storage subsystem, a look-up table that maps different operating temperatures to different amplitude values of the pre-color pulses, and wherein the amplitude of the pre-color pulse is dynamically tuned based at least on an output of the look-up table. In this example and/or other examples, for each pixel of the plurality of pixels, a pulse width of the pre-color pulse may be fixed. In this example and/or other examples, the storage subsystem may hold instructions executable by the logic subsystem to for each pixel of the plurality of pixels, dynamically tune a pulse width of the pre-color pulse based at least on the operating temperature measurement of the plurality of laser light sources; and generate, via the laser light source, the pre-color pulse with the dynamically tuned pulse width, and subsequently generate the primary color pulse. In this example and/or other examples, dynamically tuning the pulse width of the pre-color pulse may include setting the pulse width to a first pulse width value based at least on the operating temperature being less than a threshold temperature and setting the pulse width to a second pulse width value greater than the first pulse width value based least one the operating temperature being greater than the threshold temperature. In this example and/or other examples, the amplitude of the pre-color pulse may be dynamically tuned according to an update rate that corresponds to a frame rate of the near-eye display. In this example and/or other examples, the amplitude of the pre-color pulse may be dynamically tuned according to an update rate that is dynamically adjustable based at least on an operating condition of the augmented-reality device.

In another example, a method for controlling an augmented-reality device including a near-eye display, wherein the near-eye display includes a laser light source configured to perform a display scan operation, wherein the display scan operation includes, for each pixel of a plurality of pixels that collectively form a field of view of the near-eye display, generating a pre-color pulse and subsequently generating a primary color pulse, the method comprises receiving, from a temperature sensor of the augmented-reality device, an operating temperature measurement of the laser light source, for each pixel of the plurality of pixels of the near-eye display, dynamically tuning an amplitude of the pre-color pulse based at least on the operating temperature measurement of the laser light source, and generating, via the laser light source, the pre-color pulse with the dynamically tuned amplitude, and subsequently generate the primary color pulse. In this example and/or other examples, dynamically tuning the amplitude of the pre-color pulse may include setting the amplitude to a first amplitude value based at least on the operating temperature being less than a threshold temperature and setting the amplitude to a second amplitude value greater than the first amplitude value based least one the operating temperature being greater than the threshold temperature. In this example and/or other examples, the method may further comprise storing, in a storage subsystem of the augmented-reality device, a look-up table that maps different operating temperatures to different amplitude values of the pre-color pulses, and wherein the amplitude of the pre-color pulse is dynamically tuned based at least on an output of the look-up table. In this example and/or other examples, the method may further comprise for each pixel of the plurality of pixels, dynamically tuning a pulse width of the pre-color pulse based at least on the operating temperature measurement of the plurality of laser light sources, and generating, via the laser light source, the pre-color pulse with the dynamically tuned pulse width, and subsequently generating the primary color pulse. In this example and/or other examples, dynamically tuning the pulse width of the pre-color pulse may include setting the pulse width to a first pulse width value based at least on the operating temperature being less than a threshold temperature and setting the pulse width to a second pulse width value greater than the first pulse width value based least one the operating temperature being greater than the threshold temperature. In this example and/or other examples, the pulse width of the pre-color pulse may be dynamically tuned according to an update rate that corresponds to a frame rate of the near-eye display. In this example and/or other examples, the pulse width of the pre-color pulse may be dynamically tuned according to an update rate that is dynamically adjustable based at least on an operating condition of the augmented-reality device.

In yet another example, an augmented-reality device, comprises a near-eye display including a laser light source configured to perform a display scan operation, wherein the display scan operation includes, for each pixel of a plurality of pixels that collectively form a field of view of the near-eye display, generating a pre-color pulse and subsequently generating a primary color pulse, a temperature sensor configured to output an operating temperature measurement of the laser light source, a logic subsystem, and a storage subsystem holding instructions executable by the logic subsystem to receive the operating temperature measurement from the temperature sensor, and for each pixel of the plurality of pixels of the near-eye display, dynamically tune at least one of an amplitude and a pulse width of the pre-color pulse based at least on the operating temperature measurement of the laser light source, and generate, via the laser light source, the pre-color pulse with the dynamically tuned amplitude and/or the dynamically tuned pulse width, and subsequently generate the primary color pulse. In this example and/or other examples, dynamically tuning the amplitude of the pre-color pulse may include setting the amplitude to a first amplitude value based at least on the operating temperature being less than a threshold temperature and setting the amplitude to a second amplitude value greater than the first amplitude value based least one the operating temperature being greater than the threshold temperature. In this example and/or other examples, the amplitude of the pre-color pulse may be dynamically tuned based at least on a function that increases exponentially as the operating temperature increases. In this example and/or other examples, dynamically tuning the pulse width of the pre-color pulse may include setting the pulse width to a first pulse width value based at least on the operating temperature being less than a threshold temperature and setting the pulse width to a second pulse width value greater than the first pulse width value based least one the operating.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An augmented-reality device, comprising:

a near-eye display including a laser light source configured to perform a display scan operation, wherein the display scan operation includes, for each pixel of a plurality of pixels that collectively form a field of view of the near-eye display, generating a pre-color pulse and subsequently generating a primary color pulse;

a temperature sensor configured to output an operating temperature measurement of the laser light source;

a logic subsystem; and a storage subsystem holding instructions executable by the logic subsystem to:

receive the operating temperature measurement from the temperature sensor; and for each pixel of the plurality of pixels of the near-eye display, dynamically tune an amplitude of the pre-color pulse based at least on the operating temperature measurement of the laser light source; and generate, via the laser light source, the pre-color pulse with the dynamically tuned amplitude, and subsequently generate the primary color pulse.

2. The augmented-reality device of claim 1, wherein dynamically tuning the amplitude of the pre-color pulse includes setting the amplitude to a first amplitude value based at least on the operating temperature being less than a threshold temperature and setting the amplitude to a second amplitude value greater than the first amplitude value based at least on the operating temperature being greater than the threshold temperature.

3. The augmented-reality device of claim 1, wherein the amplitude of the pre-color pulse is dynamically tuned based at least on a function that increases exponentially as the operating temperature increases.

4. The augmented-reality device of claim 1, wherein the storage subsystem holds instructions executable by the logic subsystem to:

store, in the storage subsystem, a look-up table that maps different operating temperatures to different amplitude values of the pre-color pulses, and wherein the amplitude of the pre-color pulse is dynamically tuned based at least on an output of the look-up table.

5. The augmented-reality device of claim 1, wherein for each pixel of the plurality of pixels, a pulse width of the pre-color pulse is fixed.

6. The augmented-reality device of claim 1, wherein the storage subsystem holds instructions executable by the logic subsystem to:

for each pixel of the plurality of pixels, dynamically tune a pulse width of the pre-color pulse based at least on the operating temperature measurement of the plurality of laser light sources; and generate, via the laser light source, the pre-color pulse with the dynamically tuned pulse width, and subsequently generate the primary color pulse.

7. The augmented-reality device of claim 1, wherein dynamically tuning the pulse width of the pre-color pulse includes setting the pulse width to a first pulse width value based at least on the operating temperature being less than a threshold temperature and setting the pulse width to a second pulse width value greater than the first pulse width value based at least on the operating temperature being greater than the threshold temperature.

8. The augmented-reality device of claim 1, wherein the amplitude of the pre-color pulse is dynamically tuned according to an update rate that corresponds to a frame rate of the near-eye display.

9. The augmented-reality device of claim 1, wherein the amplitude of the pre-color pulse is dynamically tuned according to an update rate that is dynamically adjustable based at least on an operating condition of the augmented-reality device.

10. A method for controlling an augmented-reality device including a near-eye display, wherein the near-eye display includes a laser light source configured to perform a display scan operation, wherein the display scan operation includes, for each pixel of a plurality of pixels that collectively form a field of view of the near-eye display, generating a pre-color pulse and subsequently generating a primary color pulse, the method comprising:

receiving, from a temperature sensor of the augmented-reality device, an operating temperature measurement of the laser light source;

for each pixel of the plurality of pixels of the near-eye display, dynamically tuning an amplitude of the pre-color pulse based at least on the operating temperature measurement of the laser light source; and generating, via the laser light source, the pre-color pulse with the dynamically tuned amplitude, and subsequently generate the primary color pulse.

11. The method of claim 10, wherein dynamically tuning the amplitude of the pre-color pulse includes setting the amplitude to a first amplitude value based at least on the operating temperature being less than a threshold temperature and setting the amplitude to a second amplitude value greater than the first amplitude value based at least on the operating temperature being greater than the threshold temperature.

12. The method of claim 10, further comprising:

storing, in a storage subsystem of the augmented-reality device, a look-up table that maps different operating temperatures to different amplitude values of the pre-color pulses, and wherein the amplitude of the pre-color pulse is dynamically tuned based at least on an output of the look-up table.

13. The method of claim 10, further comprising:

for each pixel of the plurality of pixels, dynamically tuning a pulse width of the pre-color pulse based at least on the operating temperature measurement of the plurality of laser light sources; and generating, via the laser light source, the pre-color pulse with the dynamically tuned pulse width, and subsequently generating the primary color pulse.

14. The method of claim 13, wherein dynamically tuning the pulse width of the pre-color pulse includes setting the pulse width to a first pulse width value based at least on the operating temperature being less than a threshold temperature and setting the pulse width to a second pulse width value greater than the first pulse width value based at least on the operating temperature being greater than the threshold temperature.

15. The method of claim 13, wherein the pulse width of the pre-color pulse is dynamically tuned according to an update rate that corresponds to a frame rate of the near-eye display.

16. The method of claim 13, wherein the pulse width of the pre-color pulse is dynamically tuned according to an update rate that is dynamically adjustable based at least on an operating condition of the augmented-reality device.

17. An augmented-reality device, comprising:

a near-eye display including a laser light source configured to perform a display scan operation, wherein the display scan operation includes, for each pixel of a plurality of pixels that collectively form a field of view of the near-eye display, generating a pre-color pulse and subsequently generating a primary color pulse;

a temperature sensor configured to output an operating temperature measurement of the laser light source;

a logic subsystem; and a storage subsystem holding instructions executable by the logic subsystem to:

receive the operating temperature measurement from the temperature sensor; and for each pixel of the plurality of pixels of the near-eye display, dynamically tune at least one of an amplitude and a pulse width of the pre-color pulse based at least on the operating temperature measurement of the laser light source; and generate, via the laser light source, the pre-color pulse with the dynamically tuned amplitude and/or the dynamically tuned pulse width, and subsequently generate the primary color pulse.

18. The augmented-reality device of claim 17, wherein dynamically tuning the amplitude of the pre-color pulse includes setting the amplitude to a first amplitude value based at least on the operating temperature being less than a threshold temperature and setting the amplitude to a second amplitude value greater than the first amplitude value based at least on the operating temperature being greater than the threshold temperature.

19. The augmented-reality device of claim 17, wherein the amplitude of the pre-color pulse is dynamically tuned based at least on a function that increases exponentially as the operating temperature increases.

20. The augmented-reality device of claim 17, wherein dynamically tuning the pulse width of the pre-color pulse includes setting the pulse width to a first pulse width value based at least on the operating temperature being less than a threshold temperature and setting the pulse width to a second pulse width value greater than the first pulse width value based at least on the operating temperature being greater than the threshold temperature.

* * * * *